(12) United States Patent
Tang et al.

(10) Patent No.: US 11,376,553 B2
(45) Date of Patent: Jul. 5, 2022

(54) SUPERHYDROPHOBIC POLYPROPYLENE POROUS FILM, PREPARATION METHOD THEREFOR, AND METHOD FOR IMPROVING HYDROPHOBICITY OF POLYPROPYLENE POROUS FILM

(71) Applicant: Tianjin University of Science and Technology, Tianjin (CN)

(72) Inventors: Na Tang, Tianjin (CN); Yangyang Song, Tianjin (CN); Lei Zhang, Tianjin (CN); Xingxing Shi, Tianjin (CN); Songbo Wang, Tianjin (CN); Penggao Cheng, Tianjin (CN); Wei Du, Tianjin (CN); Jianping Zhang, Tianjin (CN)

(73) Assignee: Tianjin University of Science and Technology, Tianjin (CN)

( * ) Notice: Subject to any disclaimer, the term of this patent is extended or adjusted under 35 U.S.C. 154(b) by 0 days.

(21) Appl. No.: 17/526,828

(22) Filed: Nov. 15, 2021

(65) Prior Publication Data
US 2022/0072480 A1 Mar. 10, 2022

Related U.S. Application Data

(63) Continuation of application No. PCT/CN2020/115975, filed on Sep. 17, 2020.

(30) Foreign Application Priority Data

Feb. 24, 2020 (CN) .......................... 202010113160.2

(51) Int. Cl.
| | |
|---|---|
| *B01D 67/00* | (2006.01) |
| *B01D 69/02* | (2006.01) |
| *B01D 71/26* | (2006.01) |
| *B29C 41/00* | (2006.01) |
| *B29C 41/02* | (2006.01) |
| *B29C 41/52* | (2006.01) |
| *C23C 16/40* | (2006.01) |
| *C23C 16/455* | (2006.01) |
| *C23C 16/56* | (2006.01) |
| *B29K 23/00* | (2006.01) |
| *B29L 31/00* | (2006.01) |

(52) U.S. Cl.
CPC ..... *B01D 67/0037* (2013.01); *B01D 67/0013* (2013.01); *B01D 67/0095* (2013.01); *B01D 69/02* (2013.01); *B01D 71/26* (2013.01); *B29C 41/003* (2013.01); *B29C 41/02* (2013.01); *B29C 41/52* (2013.01); *C23C 16/405* (2013.01); *C23C 16/45525* (2013.01); *C23C 16/56* (2013.01); *B01D 2323/04* (2013.01); *B01D 2323/08* (2013.01); *B01D 2323/26* (2013.01); *B01D 2323/345* (2013.01); *B01D 2325/02* (2013.01); *B01D 2325/24* (2013.01); *B01D 2325/38* (2013.01); *B29K 2023/12* (2013.01); *B29L 2031/755* (2013.01)

(58) Field of Classification Search
CPC .......... C08L 23/12; C08L 23/16; C08L 51/06; C09K 23/54; B01D 67/00; B01D 67/0002; B01D 67/0037
See application file for complete search history.

(56) References Cited

U.S. PATENT DOCUMENTS

| | | | | |
|---|---|---|---|---|
| 2006/0024981 A1* | 2/2006 | Nakamura | ........ | H01L 21/02667 438/795 |
| 2018/0169997 A1* | 6/2018 | Dill | ........................ | D06N 3/047 |

FOREIGN PATENT DOCUMENTS

| | | | |
|---|---|---|---|
| CN | 102675681 A | | 9/2012 |
| CN | 102728238 A | | 10/2012 |
| CN | 103191855 A | | 7/2013 |
| CN | 104888612 A | | 9/2015 |
| CN | 105983350 A | * | 10/2016 |
| CN | 107815665 A | | 3/2018 |
| GB | 2514539 A | | 12/2014 |
| JP | 2004267833 A | * | 9/2004 |

OTHER PUBLICATIONS

Han et al. "Research on Nanometer Silicone Emulsion Modified iPP/TiO2 Superhydrophobic and Self-Cleaning Coblended Microporous Membrane" (Membrane Science and Technology, 36, 3, 2016, p. 41-47) (Year: 2016).*
Xu et al. "Hydrophilization of porous polypropylene membranes by atomic layer deposition of TiO2 for simultaneously improved permeability and selectivity" (Journal of Membrane Science, 448, 2013, p. 215-222) (Year: 2013).*

(Continued)

*Primary Examiner* — Ryan B Huang
(74) *Attorney, Agent, or Firm* — Andrew D. Fortney; Central California IP Group, P.C.

(57) ABSTRACT

A superhydrophobic polypropylene porous film, including a polypropylene porous film substrate, titanium dioxide layers and a surface modifier layer, is disclosed. The titanium dioxide layers are deposited on the surface of the polypropylene porous film substrate by atomic deposition technology; a surface modifier is coated on the titanium dioxide layers; hydrophobic bonds are formed between the titanium dioxide layers and the surface modifier layer; the superhydrophobic polypropylene porous film has a water contact angle greater than 150 degrees, a rolling angle less than 10 degrees, an aperture of 0.1-0.4 µm, a porosity of 50%-80%, a tensile strength of 30-50 MPa, and an elongation at break of 10%-30%. The superhydrophobic polypropylene porous film maintains the chemical resistance, rigidity, and porosity of the polypropylene porous film, and has superhydrophobic properties and a good separation effect after working for 80 hours, thus greatly increasing the service life, and reducing operation costs and working costs in a membrane distillation process.

18 Claims, 1 Drawing Sheet

(56) References Cited

OTHER PUBLICATIONS

Qiang Xu et al.; "Hydrophilization of Porous Polypropylene Membranes by Atomic Layer Deposition of $TiO_2$ for Simultaneously Improved Permeability and Selectivity"; pp. 215-222; Journal of Membrane Science, No. 448; Aug. 19, 2013; Elsevier B.V.

Huaiyuan Han et al.; "Research on Nanometre Silicone Emulsion Modified iPP/TiO2 Superhydrophobic and Selfcleaning Microporous Membrane;" Membrane Sci. Tech.; vol. 36, No. 3, pp. 41-47; Jun. 30, 2016; China Academic Journal Publishing House; www.cnki.net.

International Search Report (with English translation) and Written Opinion; ISA/CN dated Dec. 21, 2020; International Application No. PCT/CN2020/115975; International Filing Date Sep. 17, 2020; 8 pages; National Intellectual Property Administration (ISA/CN), Beijing, China.

\* cited by examiner

SUPERHYDROPHOBIC POLYPROPYLENE POROUS FILM, PREPARATION METHOD THEREFOR, AND METHOD FOR IMPROVING HYDROPHOBICITY OF POLYPROPYLENE POROUS FILM

TECHNICAL FIELD

The invention belongs to the field of polymer material science and film separation technology, and relates to a method for modifying a polymer separation film, and more specifically to a superhydrophobic polypropylene porous film, a preparation method thereof, and a method to improve the hydrophobicity of polypropylene porous film.

BACKGROUND

Hydrophobic microporous membranes can be used as the transfer medium of membrane contactors in a variety of new membrane separation processes, including membrane distillation, membrane extraction, membrane absorption, membrane stripping, and membrane adsorption. Membrane Distillation (abbreviated as MD) is the evaporation process of solvents or solutes in solution. Compared with other membrane separation technologies, the technology has the advantage of being able to operate at low temperature and normal pressure and effectively using cheap energy sources (such as solar energy, industrial waste heat, other waste heat), which has great competitiveness in today's society with energy shortage everywhere. MD has a great advantage in concentrating high-concentration saline solution. In the reverse osmosis process, it can only be concentrated to a certain concentration, while the MD process concentrates it to a supersaturated solution. In addition, the membrane distillation process concentrates fruit juice and Chinese traditional medicine. They also have incomparable advantages. However, the core and problem of the large-scale industrial application of MD technology is the selection of membrane materials and the utilization of energy.

Polypropylene is a kind of thermoplastic polymer made by polymerizing a propylene monomer. Polypropylene is often used to prepare household plastic products. Due to its good acid and alkali resistance, high hydrophobicity and thermal stability, and low price, it is expected to become the mainstream material for hydrophobic microporous membranes.

Titanium dioxide ($TiO_2$) has photocatalytic properties. When $TiO_2$ is irradiated by ultraviolet (UV) light with a wavelength of less than 387.5 nm, the electrons transition from the valence band to the conduction band to form electron-hole pairs. At the same time, hydroxyl radicals have very high activity, can react with silane coupling agents to form nano-dendritic structures, greatly improve the surface roughness of the film, and then improve the hydrophobicity of the film surface. Some scholars have applied this method to the preparation of superhydrophobic microporous membranes for MD. Meng et al. coated the surface of PVDF with $TiO_2$ nanoparticles, and then combined them with perfluorooctyltrichlorosilane (1H, 1H, 2H) or 2H-perfluorododecyltrichlorosilane under UV light (a FTCS reaction) to produce a superhydrophobic PVDF membrane with a contact angle greater than 160°. It was found in the process of applying it to MD that the salt rejection rate was significantly increased and the wetting of the membrane pores could be effectively relieved (S. Meng, Y. Ye, J. Mansouri, et al. Fouling and crystallisation behaviour of superhydrophobic nano-composite PVDF membranes in direct contact membrane distillation. Journal of Membrane Science, 2014, 463: 102-112). This method is used to improve the hydrophobicity of the polypropylene porous membrane. After the treatment, the polypropylene porous membrane has the following problems: 1. After the polypropylene porous membrane runs for a long time, the $TiO_2$ nanoparticle film coated on the surface of the polypropylene porous membrane is easy to fall off, resulting in the polypropylene porous membrane having a short service life; 2. After the hydrophobicity of the polypropylene porous membrane is improved, its pore size, porosity, tensile strength, and elongation at break are significantly lower than those of the polypropylene porous membrane before treatment, which lead to reduction of the performance of the membrane when the polypropylene porous membrane is used in the membrane distillation process.

In order to solve the above problems, the present invention is disclosed.

INVENTION SUMMARY

In view of the shortcomings of the prior art, the purpose of the present invention is to provide a super-hydrophobic modification method for polypropylene porous film. The modified super-hydrophobic polypropylene porous film prepared by the invention has a significant modification effect under the condition of not changing the excellent chemical resistance and higher strength of polypropylene: the hydrophobic performance of the product film is greatly improved with higher contact angle, smaller rolling angle and basically unchanged original porosity, pore size and pore size distribution; while the hydrophobicity of the product film is increased, and after the membrane distillation process, the film becomes more resistant to wetting and has longer service life.

The first aspect of the present invention provides a superhydrophobic polypropylene porous film, which in turn includes a polypropylene porous film substrate, titanium dioxide layers and a surface modifier layer, the titanium dioxide layers being deposited on the surface of the polypropylene porous film substrate by atomic deposition technology. The surface modifier is coated on the titanium dioxide layers; a hydrophobic bond is formed between the titanium dioxide layers and the surface modifier layer, and the superhydrophobic polypropylene porous film has a water contact angle greater than 150°, a rolling angle less than 10°, a pore size of 0.1 μm~0.4 μm, a porosity of 50%~80%, a tensile strength of 30 MPa~50 MPa, and an elongation at break of 10%~30%.

Herein, the word "superhydrophobic" in the superhydrophobic polypropylene porous film in the present invention refers to its high hydrophobic performance, and further refers to polypropylene porous film with a water contact angle greater than 150° and less than 180°, and a rolling angle less than 10° and greater than 0°.

In some embodiments, the titanium dioxide layers are deposited on the surface of the polypropylene porous film substrate by atomic deposition technology, and 10 to 500 cycles of titanium dioxide layers are deposited on the surface of the polypropylene porous film substrate; the surface modifier layer is nanometer silicone emulsion, and the hydrophobic bond is a Si—O—Ti bond. Among them, the main component of nano-silicone emulsion is trimethylsilanol. After illuminating, titanium dioxide will form free hydroxyl groups, and then the hydroxyl groups on trimethylsilanol and free hydroxyl groups on titanium undergo dehydration condensation reaction to form Si—O—Ti bond, which thereby plays a role in improving the hydrophobicity of the surface of the polypropylene porous film, and the hydrophobic bond is a Si—O—Ti bond.

The second aspect of the present invention provides a method for preparing the superhydrophobic polypropylene porous film according to the first aspect of the present invention, which includes the following steps:

(1) Taking a polypropylene porous film substrate;
(2) Using the atomic deposition method, depositing titanium dioxide layers onto the surface of the polypropylene porous film substrate to obtain a polypropylene porous film with titanium dioxide layers on the surface;
(3) Spraying a surface modifier onto the surface of the polypropylene porous film with titanium dioxide layers on the surface, then illuminating, rinsing, and drying to obtain the superhydrophobic polypropylene porous film;

In some embodiments, the preparation method of the polypropylene porous membrane substrate in step (1) includes the following steps:

(11) Weighing the raw materials polypropylene and a thinner; based on the mass percentage, the mass of the polypropylene is 17~35% of the mass of the product polypropylene porous film substrate, and the weight of a diluent (e.g., the thinner) is 65~83% of the mass of the product polypropylene porous film substrate.
(12) Adding the weighed raw materials in Step (11) to a reactor and stirring under nitrogen (e.g., while passing nitrogen through the reactor to protect the reactor), and heating to 160° C.~300° C. while stirring to obtain a casting liquid;
(13) Coating the casting liquid obtained in Step (12) on the surface of a polyester non-woven fabric and scraping it into a flat plate shape, and then immersing the whole fabric in the flat plate shape in a water bath or oil bath at 0° C. to 130° C. to obtain a formed film; and
(14) Immersing the formed film obtained in Step (13) in an extraction liquid for 4-12 hours ultrasonically, then drying to obtain the polypropylene porous film substrate.

In further embodiments, the raw materials in Step (11) further include one or more additives (e.g., selected from adipic acid, suberic acid and dibenzylidene sorbitol); based on the mass percentage, the mass of the additive(s) is 0-3% of the polypropylene porous film substrate, and one or more diluents (e.g., selected from dimethyl phthalate, diphenyl ether, diethyl phthalate, phosphoric acid tributyl ester, dibutyl phthalate, dioctyl phthalate and soybean oil), and the extractant in Step (14) may be one or more selected from methanol, ethanol, propanol, n-hexane, cyclohexane and acetone. The melt index of the polypropylene may be from 0 to 20.

In some embodiments, in Step (2), an atomic deposition method is adopted, and the steps of depositing a titanium dioxide layer on the surface of the polypropylene porous film are:

(21) placing the atomic layer deposition chamber under vacuum, placing the polypropylene porous film into the reaction chamber, and heating the deposition chamber to 50-150° C.;
(22) passing a gaseous titanium-containing precursor into the deposition chamber for 100 to 1000 milliseconds, and then purging the deposition chamber with an inert gas at a flow rate of 10 to 300 sccm for 10 to 60 seconds;
(23) passing a gaseous oxygen-containing precursor into the reaction chamber for 10 to 500 milliseconds, and purging the deposition chamber with an inert gas at a flow rate of 10 to 300 sccm for 10 to 60 seconds to complete the deposition of the titanium dioxide layer; and
(24) repeating steps (22)-(23) for 10-500 cycles of titanium dioxide layer deposition on the surface of the polypropylene porous film.

Among them, completing Steps (22) and (23) once is one cycle of titanium dioxide layer deposition.

Among them, in Step (22) and Step (23), the gaseous titanium-containing precursor and the gaseous oxygen-containing precursor are passed into the reaction chamber using an atomic layer depositor (D100-4882, Chongqing Nuotu Technology Co., Ltd.). The instrument is completely sealed from the external environment, and the amount of gaseous titanium-containing precursor and gaseous oxygen-containing precursor can be controlled by controlling the running time of the program in the instrument.

Preferably, the vacuum in Step (21) is 0-15 mbar; the titanium-containing precursor in Step (22) is a titanium alkoxide, a titanium halide or a titanium alkylphthalamide, preferably titanium tetraisopropoxide; the oxygen-containing precursor in Step (23) is $O_3$, $H_2O$ or $H_2O_2$; the inert gas in Step (22) and Step (23) is Ar or $N_2$.

Preferably, in Step (3), the surface modifier or nano-silicone silicon emulsion is present in an amount of 0.1-10 wt %, wherein 0.1-10 wt % of the nano-silicone emulsion refers to the mass fraction of silicon in the nano-silicone emulsion; the illuminating conditions are: irradiating with a 100-1000 joule xenon lamp for 1 to 200 minutes.

Among them, the main component of the nano-silicone emulsion is trimethylsilanol. After illumination, titanium dioxide will form free hydroxyl groups, and then the hydroxyl groups on trimethylsilanol and free hydroxyl groups on titanium undergo a dehydration condensation reaction to form a Si—O—Ti bond to improve the hydrophobicity of the polypropylene porous film surface.

The third aspect of the present invention provides a method for improving the hydrophobicity of the polypropylene porous film without changing its pore size, porosity, tensile strength, and elongation at break: firstly, depositing titanium dioxide layers on the surface of the polypropylene porous film by atomic layer deposition, spraying a surface modifier on the surface of the titanium dioxide layers, and then illuminating the polypropylene porous film with the titanium dioxide layers and the surface modifier thereon.

Preferably, 10 to 500 cycles of atomic layer deposition are used to deposit the titanium dioxide layers on the surface of the polypropylene porous film, the surface modifier is a nano-silicone emulsion, and the illuminating conditions are: irradiating with a 100 to 1000 joules xenon lamp for 1~200 minutes.

Herein, the polypropylene porous film is only a representative polymer separation film, which improves the hydrophobicity of the polypropylene porous film without changing its pore size, porosity, tensile strength, and/or elongation at break. The method is also suitable for improving the wetting resistance and life span of the film. The modification method of the present invention can be applied to many high molecular weight polymers whose hydrophilicity and hydrophobicity cannot be modified by the usual solution method due to poor solubility at room temperature. Since the polypropylene porous film does not react with any reagents at room temperature, the present invention adopts a method combining atomic layer deposition (ALD) and photocatalysis to prepare the modified superhydrophobic polypropylene porous film.

Compared with the prior art, the present invention has the following beneficial effects:

1. In the present invention, a superhydrophobic polypropylene porous film is prepared by a method combining atomic layer deposition (ALD) and photocatalysis. The superhydrophobic polypropylene porous film has a water contact angle greater than 150° and a rolling angle less than 10°, a pore size of 0.1 μm~0.4 μm, a porosity of 50% to 80%, a tensile strength of 30 MPa to 50 MPa and an elongation at break of 10% to 30%. Compared with polypropylene porous films that have not been improved in hydrophobicity, the superhydrophobic polypropylene porous film prepared by the present invention not only maintains the excellent chemical resistance, rigidity (tensile strength and elongation at break), and porous characteristics of polypropylene porous film (pore size and porosity), and also has super-hydrophobic properties. Among them, the contact angle of the original polypropylene porous film is 100°~130° without rolling angle, while the superhydrophobic polypropylene porous film has a water contact angle greater than 150° and a rolling angle less than 10°, which indicate the hydrophobicity of the polypropylene porous film is significantly improved.
2. The present invention uses atomic layer deposition technology to deposit titanium dioxide layers on the surface of the polypropylene porous film for 10 to 500 cycles. ALD can deposit titanium dioxide layers on the surface of the polypropylene porous film with a higher specific surface area and uniformly. Compared to directly coating titanium dioxide nanoparticles on the polypropylene porous film, the titanium dioxide layers deposited on the surface of the polypropylene porous film of the present invention are stronger, and not easy to fall off during the membrane distillation process. After the superhydrophobic polypropylene porous film prepared by the present invention runs for 80 hours, and its performance is still very good. Therefore, the superhydrophobic polypropylene porous film has a longer service life, which reduces the operating cost and running cost of the MD process.
3. The invention specifically selects a nano silicon emulsion with low surface energy and low cost as the surface modifier, and adopts a coating operation on the surface of the photocatalytic PP/TiO$_2$ porous film. The main component of the nano-silicone emulsion is trimethylsilanol. After light treatment, titanium dioxide will form free hydroxyl groups, and then the hydroxyl groups on trimethylsilanol and free hydroxyl groups on titanium undergo a dehydration condensation reaction to form Si—O—Ti bonds, thereby improving the surface hydrophobicity of the polypropylene porous film. The microporous film prepared by this method improves the hydrophobicity of the microporous film on the basis of maintaining the original film's pore size and porosity, reducing the rolling angle of the polypropylene porous film, and relieving the pore wetting of the polypropylene porous film, which effectively reduces film pollution.
4. The modification method of the superhydrophobic polypropylene porous film of the present invention is simple, easy to operate, and the raw materials (e.g., polypropylene and nano-silicone emulsion) are cheap and easy to be obtained.

EXAMPLES

Example 1

Figure 1:
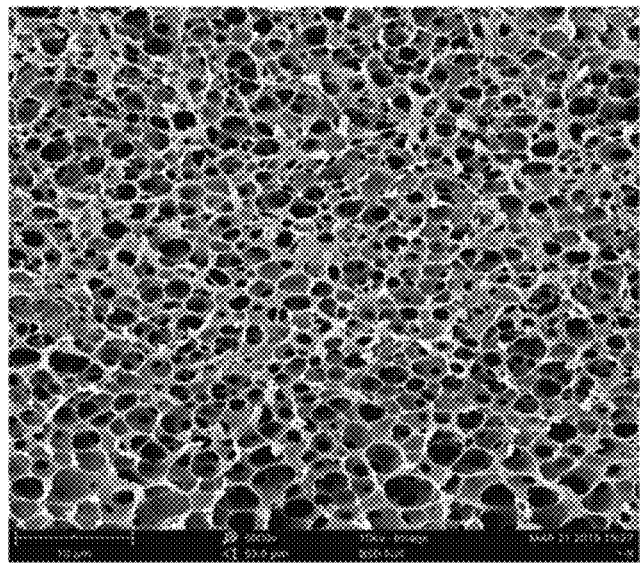
FIG. 1 is an SEM image of a film section of a polypropylene porous film Sample 1 prepared in Example 1.

This example is to prepare a polypropylene porous film Sample 1.
(11) The mass fraction of polypropylene is 16.5%, the diluent is 41.5% of soybean oil and 41.5% of tributyl phosphate, and the additive is 0.5% of adipic acid;
(12) Adding the mixed raw materials weighed in step (11) into the reactor, adding nitrogen to protect the reaction, heating to 180° C., mechanically stirring for 4 hours and then stirring at low speed for 3 hours to defoam to obtain a homogeneous film casting solution;
(13) scraping the film casting solution obtained in (12) on the surface of a polyester non-woven fabric into a flat plate at 180° C., and then putting it in a 30° C. water tank to cool and solidify.
(14) Extracting the film prepared in step (13) ultrasonically with n-hexane and ethanol for 4 hours with the extractant refreshed every 2 hours, then placing it in a vacuum oven at 70° C. to dry so as to obtain a polypropylene porous film Sample 1.

The sample has a honeycomb pore structure with good film cross-section connectivity. The final product has a porosity of 65.37%, an average pore diameter of 0.2576 μm, an air permeability of 1.551 L·cm$^{-2}$·cm$^{-1}$, a water contact angle of 126.74°, a tensile strength of 41.07 MPa and an elongation at break of 15.72%. The sample is applied to a vacuum membrane distillation process on a 3.5% NaCl aqueous solution at a feed flow rate of 18 L·h$^{-1}$, and a feed temperature of 70° C. The film flux was 17.81 kg$^{-2}$·h$^{-1}$ and the rejection rate was 99.99%.

Example 2

In this example, using a low-temperature hydrothermal method, the surface of the polypropylene porous film prepared in Example 1 was directly coated with titanium dioxide nanoparticles, and the surface of the polypropylene porous film coated with titanium dioxide nanoparticles was sprayed with the surface modifier vinyl triethyl oxysilane, then irradiated with a 500-joule xenon lamp for 30 minutes, then rinsed with absolute ethanol, and then dried in a vacuum oven at 80° C. to obtain a superhydrophobic polypropylene porous film Sample 1.

Herein, after irritation, titanium dioxide will form free hydroxyl groups. The vinyl group of vinyl triethoxy silane undergoes an addition reaction with the free hydroxyl groups of titanium dioxide under weak alkali and photocatalytic conditions to form C—O—Ti bonds, thereby improving the surface hydrophobicity of polypropylene porous film.

The resulting product has a porosity of 58.26%, an average pore diameter of 0.1772 μm, an air permeability of 0.7019 L·cm$^{-2}$·cm$^{-1}$, a water contact angle of 140°, a tensile strength of 35.23 MPa, and an elongation at break 10.65%. The film is applied to a vacuum membrane distillation process in a 3.5% NaCl aqueous solution, at a feed flow of 30 L·h$^{-1}$ and a feed temperature of 70° C. The initial membrane flux was 14.52 kgm$^{-2}$h$^{-1}$ and the initial rejection rate was 99.99%. After 10 hours of operation, the membrane flux was 23.69 kg·m$^{-2}$·h$^{-1}$ and the rejection rate was 70%.

Example 3

In this example, with atomic deposition technology, the surface of the polypropylene porous film prepared in Example 1 was deposited with titanium dioxide layers, sprayed with the surface modifier vinyl triethoxysilane on the titanium dioxide layers, irradiated for 30 minutes using a 500-joule xenon lamp, rinsed with absolute ethanol, and then dried in a vacuum oven at 80° C. to obtain a superhydrophobic polypropylene porous film Sample 2.

In this example, the steps of depositing titanium dioxide layers on the surface of the polypropylene porous film are:
(21) After the reaction chamber of the atomic layer deposition equipment is evacuated, placing the polypropylene porous film into the reaction chamber, and heating the temperature of the reaction chamber to 100° C.;
(22) Passing the gaseous titanium-containing precursor into the reaction chamber for 400 milliseconds, and then purging with an inert gas at a flow rate of 50 sccm for 30 seconds;
(23) Then passing the gaseous oxygen-containing precursor into the reaction chamber for 100 milliseconds, and purging with an inert gas at a flow rate of 50 sccm for 30 seconds to complete the deposition of a titanium dioxide layer; and
(24) Repeating Steps (22) -(23) to deposit 200 cycles of titanium dioxide layers on the surface of the polypropylene porous film.

Completing Steps (22) and (23) once is one cycle of titanium dioxide layer deposition.

The vacuum in Step (21) is 0.5 mbar; the titanium-containing precursor in Step (22) is titanium tetraisopropoxide; the oxygen-containing precursor in Step (23) is H$_2$O; and in Steps (22) and (23) the inert gas is N$_2$.

The superhydrophobic polypropylene porous film Sample 2 has a porosity of 62.86%, an average pore size of 0.2572 μm, a gas permeability of 1.551 L·cm$^{-2}$·cm$^{-1}$, a water contact angle of 125.6°, a tensile strength of 38.54 MPa, and an elongation at break of 13.37%. The film was applied to a vacuum membrane distillation process in a 3.5% NaCl aqueous solution, at a feed flow of 30 L·h$^{-1}$ and a feed temperature of 70° C. The membrane flux was 15.47 kg m$^2$·h$^{-1}$ and the rejection rate was 99.99%. After 15 hours of operation, the membrane flux was 27.36 kg·m$^2$·h$^-$and the rejection rate was 63.76%.

Example 4

In this example, with atomic deposition technology, the surface of the polypropylene porous film prepared in Example 1 was deposited with titanium dioxide layers, sprayed with a surface modifier 0.3% nano-silicone emulsion, irradiated for 30 minutes with a 500 joule xenon lamp, rinsed with absolute ethanol, and then dried in a vacuum oven at 80° C. to obtain a superhydrophobic polypropylene porous film Sample 3.

Wherein, the method of depositing titanium dioxide layers on the surface of the polypropylene porous film is the same as in Example 3.

Figure 2:
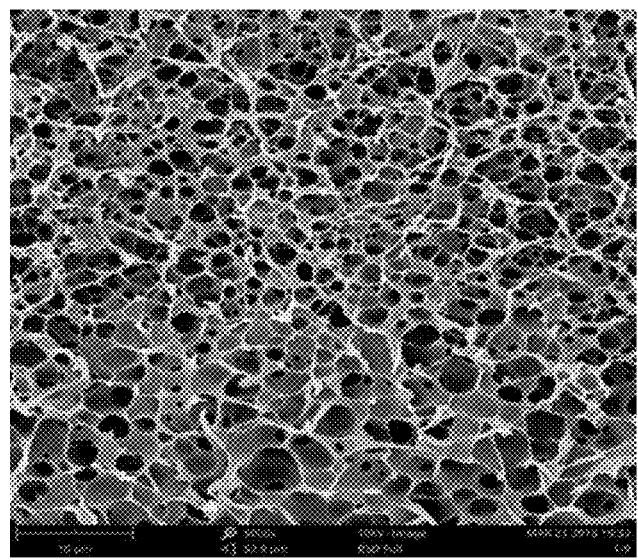
FIG. 2 is an SEM image of the film cross-section of the superhydrophobic polypropylene porous film Sample 3 prepared in Example 4.

The SEM image of the cross-section of the superhydrophobic polypropylene porous film Sample 3 is shown in FIG. 2. Compared with the SEM image of the cross-section of the polypropylene porous membrane before modification (FIG. 1), it can be seen that the structure of the modified polypropylene porous film has almost no change while the modified superhydrophobic polypropylene porous film has a double continuous pore structure in the membrane section.

The superhydrophobic polypropylene porous film Sample 3 has a porosity of 65.23%, an average pore size of 0.2526 μm, a gas permeability of 1.553 L cm$^{-2}$·cm$^{-1}$, a water contact angle of 165°, an inclination angle of 1°, a tensile strength of 41.07 MPa, and an elongation at break of 15.72%. The film is applied to a vacuum membrane distillation process in a 3.5% NaCl aqueous solution, at a feed flow rate of 18 L h$^{-1}$ and a feed temperature of 70° C. The membrane flux was 17.81 kg·m$^{-2}$·h$^{-1}$ and the rejection rate was 99.99%. After running for 80 h, the membrane flux was 17.14 kg·m$^{-2}$·h$^{-1}$ and the rejection rate was 99.99%.

Comparing the polypropylene porous film Sample 1, the superhydrophobic polypropylene porous film Sample 1, the superhydrophobic polypropylene porous film Sample 2, and the superhydrophobic polypropylene porous film Sample 3 in Examples 1-4, it can be seen that: the water contact angle of the superhydrophobic propylene porous film Sample 1 is slightly greater than that of the unmodified polypropylene porous film Sample 1, but its porosity, average pore size, air permeability, tensile strength, and elongation at break are all inferior to those of the unmodified polypropylene membrane. The porosity, average pore size, air permeability, tensile strength, and elongation at break of superhydrophobic polypropylene porous film Sample 2 is not much different from that of unmodified polypropylene porous film Sample 1, but its hydrophobicity improvement effect is poor, and the water contact angle of the film hardly changes. At the same time, the superhydrophobic polypropylene porous film Sample 1 and the superhydrophobic polypropylene porous film Sample 2 have a common problem: the superhydrophobic polypropylene porous films have a poor life span. Although the superhydrophobic polypropylene porous film Sample 2 included titanium dioxide layers deposited on the surface of the polypropylene porous film by atomic deposition technology, the titanium dioxide layers are not easy to fall off during operation, so compared with the superhydrophobic polypropylene porous film Sample 1, it can improve the service life of the superhydrophobic polypropylene porous film to a certain extent. However, after 15 hours of operation, the flux of the superhydrophobic polypropylene porous film Sample 2 was significantly increased, and the rejection performance of the superhydrophobic polypropylene porous film Sample 2 decreased.

In comparison, the superhydrophobic polypropylene porous film Sample 3 in Example 4 has better hydrophobicity, which is reflected in the increase in the water contact angle; and the rigidity and strength of the membrane material does not decrease significantly, which is reflected in the little change of tensile strength; after modification, the pore size and porosity of the film are basically unchanged, and the water contact angle of the polypropylene film is increased, and the separation performance of the membrane is improved. In terms of the hydrophobicity of the film, the prepared modified superhydrophobic polypropylene porous film has a water contact angle greater than 150° and a rolling angle less than 10°, which can alleviate the wetting of the film pores, effectively reduce film pollution, and provide MD Separation material with excellent hydrophobic properties. At the same time, after 80 hours of operation, the membrane flux was 17.14 kg·m$^{-2}$·h$^{-1}$, the rejection rate was 99.99%, and the superhydrophobic polypropylene porous film Sample 3 had a longer service life.

Example 5

This example is the preparation of Sample 4 of the superhydrophobic polypropylene porous film.

First, use the following Steps (11)-(14) to prepare polypropylene porous film:
(11) The mass fraction of polypropylene is 17%, the diluent soybean oil is 41.25%, and the diluent tributyl phosphate is 41.25%. The additive is 0.5% adipic acid;
(12) Adding the mixed raw materials weighed in Step (11) into the reactor, passing nitrogen through the reactor to protect the reaction, heating to 180° C., mechanically stirring for 4 hours and then stirring at low speed for 3 hours to defoam to obtain a homogeneous film casting solution;
(13) Scraping the film casting solution obtained in Step (12) on a surface of a polyester non-woven fabric to a flat plate at temperature of 180° C., and then cooling and solidifying in a 30° C. water tank.
(14) Ultrasonically extracting the film prepared in Step (13) with n-hexane and ethanol for 4 hours, refreshing the extractant every 2 hours, and drying in a vacuum oven at 70° C. to obtain a polypropylene porous membrane.

Then using atomic deposition technology to deposit titanium dioxide layers on the surface of the polypropylene porous film, spraying the surface modifier nano-silicone emulsion on the surface of the polypropylene porous film with titanium dioxide nanoparticles deposited on the surface, irradiating it with a 500-joule xenon lamp for 30 minutes, rinsing with absolute ethanol, and drying in a vacuum oven at 80° C. to obtain Sample 4 of superhydrophobic polypropylene porous film.

Wherein, the steps of depositing titanium dioxide layers on the surface of the polypropylene porous film are:
(21) After the reaction chamber of the atomic layer deposition equipment is evacuated, placing the polypropylene porous film into the reaction chamber, and heating the temperature of the reaction chamber to 100° C.;
(22) Passing the gaseous titanium-containing precursor into the reaction chamber for 400 milliseconds, and then purging with an inert gas at a flow rate of 55 sccm for 30 seconds;
(23) Then passing the gaseous oxygen-containing precursor into the reaction chamber for 100 milliseconds, and purging with an inert gas at a flow rate of 50 sccm for 30 seconds to complete the deposition of a titanium dioxide layer; and
(24) Repeating Steps (22)-(23) to deposit 200 cycles of titanium dioxide layers on the surface of the polypropylene porous film.

Completing Steps (22) and (23) once is one cycle of titanium dioxide layer deposition.

The vacuum in Step (21) is 0.5 mbar; the titanium-containing precursor in Step (22) is titanium tetraisopropoxide; the oxygen-containing precursor in Step (23) is $H_2O$; the inert gas in Steps (22) and (23) is Ar or $N_2$.

The superhydrophobic polypropylene porous Sample 4 has a porosity of 78.36%, an average pore diameter of 0.3895 μm, an air permeability of 2.73 $L·cm^{-2}·cm^{-1}$, a water contact angle of 151°, an inclination angle of 8°, a tensile strength of 30.76 MPa, and an elongation at break of 17.48%. The film is applied to a vacuum membrane distillation process in a 3.5% NaCl aqueous solution, at a feed flow rate of 18 $L·h^{-1}$ and a feed temperature of 70° C. The membrane flux was 21.05 $kgm^{-2}h^{-1}$ and the rejection rate was 99.99%. After running for 40 h, the membrane flux was 20.39 $kgm^{-2}h^{-1}$ and the rejection rate was 99.99%.

Example 6

This example is the preparation of Sample 5 of superhydrophobic polypropylene porous film.

First, the following Steps (11)-(14) are used to prepare a polypropylene porous film:
(11) The mass fraction of polypropylene is 32.5%, the diluent soybean oil is 33.5%, and the diluent tributyl phosphate is 33.5%. The additive is 0.5% adipic acid;
(12) Adding the mixed raw materials weighed in Step (11) into the reactor, passing nitrogen through the reactor to protect the reaction, heating to 180° C., mechanically stirring for 4 hours and then stirring at low speed for 3 hours to defoam to obtain a homogeneous film casting solution;
(13) Scraping the film casting solution obtained in Step (12) on the surface of a polyester non-woven fabric into a flat plate at the temperature of 180° C., then cooling and solidifying in a 30° C. water tank;
(14) Extracting the film prepared in Step (13) ultrasonically with n-hexane and ethanol for 4 hours, refreshing the extractant every 2 hours, then drying in a vacuum oven at 70° C. to obtain a polypropylene porous membrane.

Then with atomic deposition technology, depositing titanium dioxide layers on the surface of the polypropylene porous film, spraying the surface modifier nano silicon nano-silicone emulsion on the surface of the polypropylene porous film with titanium dioxide nanoparticles deposited on the surface, irradiating it with a 500-joule xenon lamp for 30 minutes, rinsing it with absolute ethanol, and then drying in a vacuum oven at 80° C. to obtain Sample 5 of superhydrophobic polypropylene porous film.

Herein, the steps of depositing titanium dioxide layers on the surface of the polypropylene porous film are:
(21) After the reaction chamber of the atomic layer deposition equipment is evacuated, placing the polypropylene porous film into the reaction chamber, and heating the temperature of the reaction chamber to 100° C.;
(22) Passing the gaseous titanium-containing precursor into the reaction chamber for 400 milliseconds, and then purging with an inert gas at a flow rate of 55 sccm for 30 seconds;
(23) Then passing the gaseous oxygen-containing precursor into the reaction chamber for 100 milliseconds, and purging with an inert gas at a flow rate of 50 sccm for 30 seconds to complete the deposition of a titanium dioxide layer; and
(24) Repeating Steps (22)-(23) to deposit 200 cycles of titanium dioxide layers on the surface of the polypropylene porous film.

Completing Steps (22) and (23) once is one cycle of titanium dioxide layer deposition.

The vacuum in Step (21) is 4 mbar; the titanium-containing precursor in Step (22) is titanium tetraisopropoxide; the oxygen-containing precursor in Step (23) is $H_2O$; the inert gas in Steps (22) and (23) is Ar or $N_2$.

The superhydrophobic polypropylene porous film Sample 5 has a porosity of 54.53%, an average pore diameter of 0.1124 a gas permeability of 0.45 $L·cm^{-2}·cm^{-1}$, a water contact angle of 162°, an inclination angle of 5°, a tensile strength of 47.57 MPa, and an elongation at break of 26.73%. The film was applied to a vacuum membrane distillation process in a 3.5% NaCl aqueous solution, at a feed flow rate of 18 L·h$^{-1}$ and a feed temperature of 70° C. The membrane flux was 9.78 kg·m$^{-2}$·h$^{-1}$ and the rejection rate was 99.99%. After 80 h operation, the membrane flux was 8.74 kg·m$^{-2}$·h$^{-1}$ and the rejection rate was 99.99%.

What is claimed:

1. A method of preparing a super hydrophobic polypropylene porous film, comprising, in sequence, depositing titanium dioxide layers on a surface of a polypropylene porous film substrate by atomic layer deposition, spraying a surface modifier comprising a nano-silicone emulsion on the titanium dioxide layers to obtain a polypropylene porous film with the titanium dioxide layers and a surface modifier layer thereon, and illuminating, rinsing and drying the polypropylene porous film with the titanium dioxide layers and the surface modifier layer thereon to form a hydrophobic Si—O—Ti bond between the titanium dioxide layers and the surface modifier to obtain the superhydrophobic polypropylene porous film, wherein the superhydrophobic polypropylene porous film has a water contact angle greater than 150°, a rolling angle less than 10°, a pore size of 0.1 μm to 0.4 μm, a porosity of 50% to 80%, a tensile strength of 30 MPa to 50MPa, and an elongation at break of 10% to 30%.

2. The method according to claim 1, wherein the atomic layer deposition comprises 10 to 500 cycles of titanium dioxide layer deposition on the surface of the polypropylene porous film substrate.

3. The method according to claim 2, wherein each of the cycles of titanium dioxide layer deposition comprises passing a gaseous titanium-containing precursor into an atomic layer deposition chamber with the polypropylene porous film substrate therein for 100 to 1000 milliseconds, purging the atomic layer deposition chamber with a first inert gas, passing a gaseous oxygen-containing precursor into the reaction chamber for 10 to 500 milliseconds, and purging the deposition chamber with a second inert gas.

4. The method according to claim 3, wherein the gaseous titanium-containing precursor is a titanium alkoxide, a titanium halide or a titanium alkyl phthalamine.

5. The method according to claim 3, wherein the oxygen-containing precursor is $O_3$, $H_2O$ or $H_2O_2$.

6. The method according to claim 3, wherein the reaction chamber is purged with the first inert gas at a flow rate of 10 to 300 sccm for 10 to 60 seconds.

7. The method according to claim 3, wherein the reaction chamber is purged with the second inert gas at a flow rate of 10 to 300 sccm for 10 to 60 seconds.

8. The method according to claim 1, further comprising, prior to depositing titanium dioxide layers on the surface of the polypropylene porous film substrate, preparing the polypropylene porous membrane substrate.

9. The method according to claim 8, wherein the polypropylene porous membrane substrate is prepared by:
    (11) weighing polypropylene and a thinner;
    (12) adding the polypropylene and the thinner to a reactor and heating to 160° C.~300° C. with stirring under nitrogen to obtain a casting liquid;
    (13) coating the casting liquid on a polyester non-woven fabric and scraping it into a flat plate shape, and then immersing the flat plate shape in a water bath or oil bath at 0° C. to 130° C. to obtain a formed film; and
    (14) extracting the formed film in an extraction liquid for 4-12 hours ultrasonically, then drying to obtain the polypropylene porous film substrate.

10. The method according to claim 9, wherein the extraction liquid includes an additive selected from adipic acid, suberic acid, and dibenzylidene sorbitol, a diluent selected from dimethyl phthalate, diphenyl ether, diethyl phthalate, phosphoric acid tributyl ester, dibutyl phthalate, dioctyl phthalate, and soybean oil, and an extractant selected from methanol, ethanol, propanol, n-hexane, cyclohexane, and acetone.

11. The method according to claim 1, wherein depositing the titanium dioxide layers on the surface of the polypropylene porous film comprises:
    (21) placing an atomic layer deposition chamber under vacuum, placing the polypropylene porous film into the reaction chamber, and heating the reaction chamber to 50-150° C.;
    (22) passing a gaseous titanium-containing precursor into the reaction chamber for 100 to 1000 milliseconds, and then purging the reaction chamber with a first inert gas at a flow rate of 10 to 300 sccm for 10 to 60 seconds;
    (23) passing a gaseous oxygen-containing precursor into the reaction chamber for 10 to 500 milliseconds, and purging the reaction chamber with a second inert gas at a flow rate of 10 to 300 sccm for 10 to 60 seconds; and
    (24) repeating steps (22)-(23) for 10-500 cycles.

12. The method according to claim 11, wherein the vacuum is 0-15 mbar; the titanium-containing precursor is a titanium alkoxide, titanium halide or titanium alkyl phthalamine; the oxygen-containing precursor is $O_3$, $H_2O$ or $H_2O_2$; the first inert gas is Ar or $N_2$ and the second inert gas is Ar or Nz.

13. The method according to claim 1, wherein the nano-silicone emulsion is present in an amount of 0.1-10 wt %, and illuminating the polypropylene porous film with the titanium dioxide layers and the surface modifier layer thereon comprises irradiating the polypropylene porous film with the titanium dioxide layers and the surface modifier layer thereon with a 100-1000 joule xenon lamp for 1 to 200 minutes.

14. The method according to claim 13, wherein the wt % of the nano-silicone emulsion refers to a mass fraction of silicon in the nano-silicone emulsion.

15. The method according to claim 1, wherein the polypropylene porous film with the titanium dioxide layers and the surface modifier layer thereon is irradiated with ultraviolet (UV) light for 1 to 200 minutes at a power of a 100-1000 joules.

16. The method according to claim 1, wherein the nano-silicone emulsion includes a component with a hydroxyl group that forms the Si—O—Ti bond.

17. The method according to claim 16, wherein the nano-silicone emulsion comprises trimethylsilanol.

18. The method according to claim 17, wherein the trimethylsilanol is present in an amount of 0.1-10 wt %, and the 0.1-10 wt % refers to a mass fraction of silicon in the nano-silicone emulsion.

* * * * *